United States Patent
Yamaoka et al.

(10) Patent No.: US 12,191,627 B2
(45) Date of Patent: Jan. 7, 2025

(54) OPTICAL MODULE

(71) Applicant: FURUKAWA ELECTRIC CO., LTD., Tokyo (JP)

(72) Inventors: Kazuki Yamaoka, Tokyo (JP); Maiko Ariga, Tokyo (JP); Yusuke Inaba, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 756 days.

(21) Appl. No.: 17/397,020

(22) Filed: Aug. 9, 2021

(65) Prior Publication Data
US 2021/0367398 A1 Nov. 25, 2021

Related U.S. Application Data

(63) Continuation of application No. PCT/JP2020/004780, filed on Feb. 7, 2020.

(30) Foreign Application Priority Data

Feb. 13, 2019 (JP) .................................. 2019-023984

(51) Int. Cl.
*H01S 5/0239* (2021.01)
*H01S 5/02218* (2021.01)
*H01S 5/02253* (2021.01)

(52) U.S. Cl.
CPC ........ *H01S 5/0239* (2021.01); *H01S 5/02218* (2021.01); *H01S 5/02253* (2021.01)

(58) Field of Classification Search
CPC ........................... H01S 5/0239; H01S 5/02257
(Continued)

(56) References Cited

U.S. PATENT DOCUMENTS

| 4,984,855 | A | 1/1991 | Horiuti et al. |
| 7,308,012 | B2 | 12/2007 | Namiwaka et al. |

(Continued)

FOREIGN PATENT DOCUMENTS

| CN | 101493577 A | 7/2009 |
| CN | 201780389 U * | 3/2011 |

(Continued)

OTHER PUBLICATIONS

Combined Chinese Office Action and Search Report issued on Jun. 21, 2023 in Chinese Patent Application No. 202080013696.2 (with unedited computer-generated English translation of Office Action), 13 pages.

(Continued)

*Primary Examiner* — Tuan N Nguyen
(74) *Attorney, Agent, or Firm* — Oblon, McClelland, Maier & Neustadt, L.L.P.

(57) ABSTRACT

An optical module includes: an optical functional element outputting a first light beam; a first optical part receiving the first light beam, having a predetermined effect on the first light beam, and outputting the affected first light beam as a second light beam; a second optical part receiving the second light beam, having a predetermined effect on the second light beam, outputting the affected second light beam as a third light beam, and reflecting a reflected light beam in a direction not coupled to the first optical part, the reflected light beam being generated from the second light on an incident surface on which the second light beam is incident; a housing accommodating the optical functional element, the first optical part, and the second optical part; and an optical attenuator provided inside the housing and attenuating power of the reflected light beam incident on the optical attenuator.

20 Claims, 7 Drawing Sheets

(58) Field of Classification Search
USPC .......................................................... 372/101
See application file for complete search history.

(56) References Cited

U.S. PATENT DOCUMENTS

| | | |
|---|---|---|
| 7,792,399 B2 | 9/2010 | Kato |
| 2008/0252981 A1 | 10/2008 | Yasumoto et al. |
| 2009/0185776 A1 | 7/2009 | Kato |

FOREIGN PATENT DOCUMENTS

| | | | |
|---|---|---|---|
| CN | 105388571 A | 3/2016 | |
| JP | 2-48914 U | 4/1990 | |
| JP | 11-307872 A | 11/1999 | |
| JP | H11307872 A * | 11/1999 | ............... G02B 6/42 |
| JP | 2005-19820 A | 1/2005 | |
| JP | 2008-136178 A | 6/2008 | |
| JP | 2009-175176 A | 8/2009 | |

OTHER PUBLICATIONS

International Search Report issued Apr. 14, 2020 in PCT/JP2020/004780, filed on Feb. 7, 2020, 2 pages.

\* cited by examiner

OPTICAL MODULE

CROSS-REFERENCE TO RELATED APPLICATION(S)

This application is a continuation of International Application No. PCT/JP2020/004780, filed on Feb. 7, 2020 which claims the benefit of priority of the prior Japanese Patent Application No. 2019-023984, filed on Feb. 13, 2019, the entire contents of which are incorporated herein by reference.

BACKGROUND

The present disclosure relates to an optical module.

Disclosed are optical modules including optical functional elements that output a light beam, such as semiconductor laser devices, and optical parts, such as optical isolators and lenses, accommodated in a housing (refer to Japanese Laid-open Patent Publication No. 2005-019820).

When a light beam is incident on the semiconductor laser device from the outside, it makes the operation of the semiconductor laser device unstable or broadens the linewidth of the laser light beam to deteriorate the characteristics of the semiconductor laser device, for example. To solve these problems, there has been developed a technology of disposing an optical isolator on an optical path of the laser light beam output from the semiconductor laser device to prevent the light beam from being incident on the semiconductor laser device from the outside.

SUMMARY

There is a need for providing an optical module in which deterioration of the characteristics and unstable operations of the optical module can be suppressed.

According to an embodiment, an optical module includes: an optical functional element outputting a first light beam; a first optical part receiving the first light beam, having a predetermined effect on the first light beam, and outputting the affected first light beam as a second light beam; a second optical part receiving the second light beam, having a predetermined effect on the second light beam, outputting the affected second light beam as a third light beam, and reflecting a reflected light beam in a direction not coupled to the first optical part, the reflected light beam being generated from the second light on an incident surface on which the second light beam is incident; a housing accommodating the optical functional element, the first optical part, and the second optical part; and an optical attenuator provided inside the housing and attenuating power of the reflected light beam incident on the optical attenuator in the housing.

DETAILED DESCRIPTION

In the related-art configuration, a part of the laser light beam output from the semiconductor laser device is reflected by the light beam incident surface of the optical isolator and is incident on the semiconductor laser device. The incident light beam may possibly cause problems, such as deterioration of the characteristics and unstable operations, in the semiconductor laser device.

First Embodiment

Figure 1:
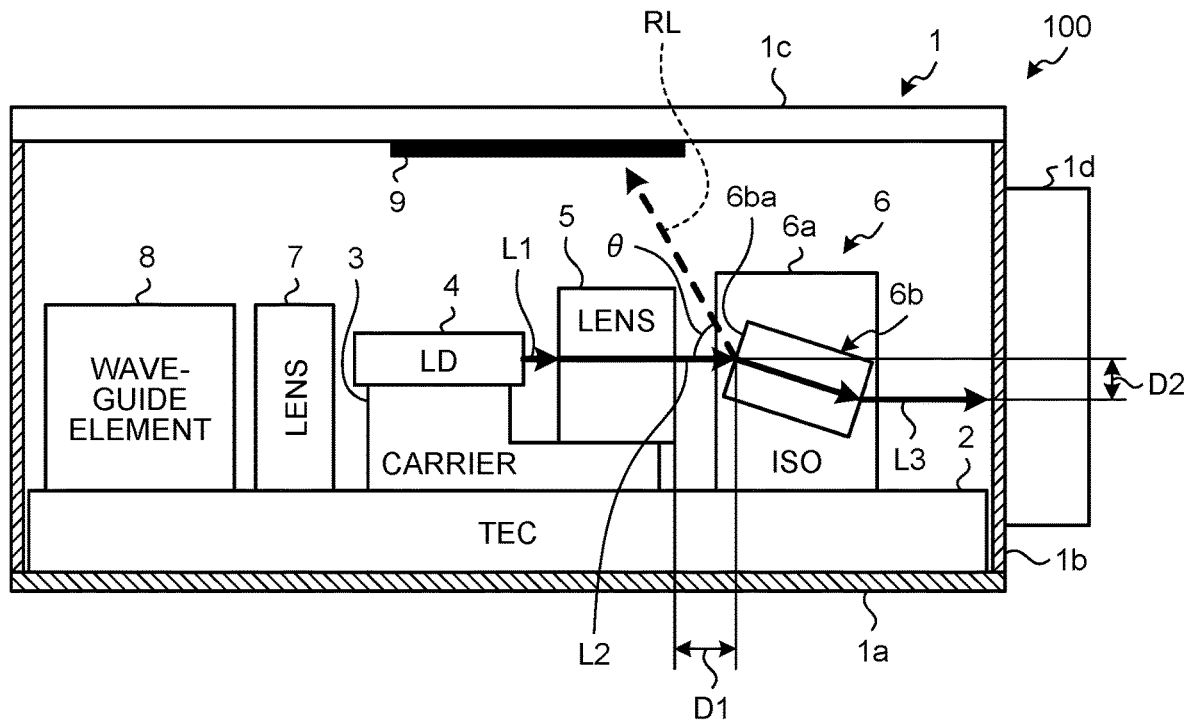
FIG. 1 is a schematic partially cutaway side view of an optical module according to a first embodiment.

FIG. 1 is a schematic partially cutaway side view of an optical module according to a first embodiment. An optical module 100 includes a housing 1. The housing 1 includes a bottom plate 1a, a side wall 1b, an upper lid 1c, and a light output part 1d. The bottom plate 1a is a plate member. The side wall 1b is a frame plate member having four surfaces, and the surfaces are substantially orthogonal to the bottom plate 1a. The upper lid 1c is a plate member disposed facing the bottom plate 1a. The light output part 1d is a tubular member provided to one surface of the side wall 1b. The side wall 1b is provided with a translucent window. The light beam can be transmitted from the inside of the housing 1 through the window and the light output part 1d.

The bottom plate 1a is made of material having high thermal conductivity, such as copper tungsten (CuW), copper molybdenum (CuMo), and aluminum oxide ($Al_2O_3$). The side wall 1b, the upper lid 1c, and the light output part 1d are made of material having a low coefficient of thermal expansion, such as Fe—Ni—Co alloy and aluminum oxide ($Al_2O_3$). When the height of the housing 1 is the height from the surface of the bottom plate 1a facing the outside of the housing 1 to the surface of the upper lid 1c facing the outside of the housing 1, the height is preferably 6.5 mm or lower to meet the recent demand for downsizing of optical modules.

The optical module 100 accommodates the following components: a thermoelectric cooling element (TEC) 2, a carrier 3, a semiconductor laser device (LD) 4, a lens 5, an optical isolator (ISO) 6, a lens 7, and a waveguide element 8.

The optical module 100 is provided with these components in the housing 1 and is airtightly sealed with the upper lid 1c.

The optical module 100 is provided as a semiconductor laser module. The following describes the configurations and the functions of the components.

A thermoelectric cooling element 2 is fixed to the bottom plate 1a. The thermoelectric cooling element 2 is supplied with electric power from the outside via a lead, which is not illustrated, and absorbs or generates heat corresponding to the direction of a current flow.

The carrier 3, the semiconductor laser device 4, the lens 5, the optical isolator 6, the lens 7, and the waveguide element 8 are mounted on the thermoelectric cooling element 2. These components are controlled to have a desired temperature by applying an electric current to the thermoelectric cooling element 2.

The semiconductor laser device 4 serving as an optical functional element is mounted on the carrier 3 and is a wavelength-tunable laser device, for example. The carrier 3 is also called a sub-mount and is made of insulating material having high thermal conductivity. The carrier 3 efficiently transfers heat generated by the semiconductor laser device 4 to the thermoelectric cooling element 2.

The semiconductor laser device 4 serving as the optical functional element is supplied with electric power from the outside via a lead, which is not illustrated, and outputs a laser light beam L1 serving as a first light beam to the lens 5. The wavelength of the laser light beam L1 is 900 nm to 1650 nm, which is suitable for a wavelength for optical communications, for example.

The lens 5 serving as a first optical part is mounted on the carrier 3. The lens 5 receives the laser light beam L1, has an effect by the refractive index on the laser light beam L1 to collimate it, and outputs the collimated laser light beam L1 as a laser light beam L2 serving as a second light beam.

The optical isolator 6 serving as a second optical part includes a magnet 6a and an optical element part 6b composed of a magnetic optical element and a polarizing plate. The optical isolator 6 receives the laser light beam L2 on an incident surface 6ba of the optical element part 6b. The optical isolator 6 has polarization and magnetic optical effects on the laser light beam L2 and outputs the affected laser light beam L2 as a laser light beam L3 serving as a third light beam. The optical isolator 6 prevents the light beam traveling from the light output part 1d from passing therethrough. As a result, the optical isolator 6 prevents the reflected light beam or the like from being incident on the semiconductor laser device 4 from the outside.

The optical axis and the incident surface 6ba of the optical element part 6b incline with respect to the optical axis of the laser light beam L2. With this configuration, a reflected light beam RL generated from the laser light beam L2 on the incident surface 6ba travels toward the upper lid 1c. As a result, the optical isolator 6 causes the reflected light beam RL to travel in a direction not coupled to the lens 5. Consequently, the present embodiment prevents the reflected light beam RL from causing deterioration of the characteristics, unstable operations, and other problems in the semiconductor laser device 4. To reduce the reflectivity, the incident surface 6ba has antireflecting (AR) coating. The reflectivity is 5% or lower and is preferably 2% or lower.

To prevent the reflected light beam RL from being coupled to the lens 5, the angle θ formed by the optical axis of the laser light beam L2 and the optical axis of the reflected light beam RL is preferably 20 degrees or larger. A distance D1 indicates the distance between the position at which the laser light beam L2 is output from the lens 5 and the position at which the laser light beam L2 is incident on the incident surface 6ba. The distance D1 is preferably 0.3 mm or larger and more preferably 0.6 mm or larger. If the angle θ is 20 degrees, and the distance D1 is 0.3 mm, the effective aperture diameter of the optical isolator 6 can be 0.5 mm or larger when the length of the incident surface 6ba of the optical element part 6b in the inclination direction is 1.0 mm.

If a beam diameter LW1 of the laser light beam L2 is 0.5 mm, the laser light beam L2 can be prevented from being shaded by the optical isolator 6. The beam diameter LW1 can be $1/e^2$ full width of a beam profile of the laser light beam L2. As described above, the angle θ and the distance D1 are preferably set such that the reflective light beam RL is not coupled to the lens 5 and that the laser light beam L2 is not shaded by the optical isolator 6 corresponding to the length of the incident surface 6ba in the inclination direction.

The optical axis of the laser light beam L2 and the optical axis of the laser light beam L3 are apart from each other by a predetermined distance D2 because the optical axis of the optical element part 6b inclines with respect to the optical axis of the laser light beam L2. The distance D2 is preferably 300 μm or smaller.

The semiconductor laser device 4 outputs a rear-end laser light beam having relatively small power from the facet (rear facet) opposite to the facet (output facet) facing the lens 5 to output laser light beam L1. The lens 7 condenses and outputs the rear-end laser light beam to the waveguide element 8.

The waveguide element 8 is a planar light wave circuit (PLC), for example, and includes a ring filter the transmission characteristics of which periodically change with the wavelength. The waveguide element 8 divides the rear-end laser light beam into two parts. The waveguide element 8 guides and outputs one part to a first photo-detecting element (PD) and causes the other part to pass through the ring filter and outputs it to a second PD, which is not illustrated. Current signals output from the first PD and the second PD are output to an external controller and used to control the wavelength of the laser light beam L1 similarly to the related-art technology.

The surface of the upper lid 1c facing the inside of the housing 1 is provided with an optical attenuator 9. The optical attenuator 9 is provided at a position on which the reflected light beam RL is incident to attenuate the power of the reflected light beam RL in the housing 1. As a result, the reflected light beam RL is further reflected to be incident on the semiconductor laser device 4, the first PD, and the second PD. Consequently, the present embodiment suppresses deterioration of the characteristics, unstable operations, and other problems in the semiconductor laser device 4 and reduction in the accuracy of controlling the wavelength of the laser light beam L1.

Figure 2:
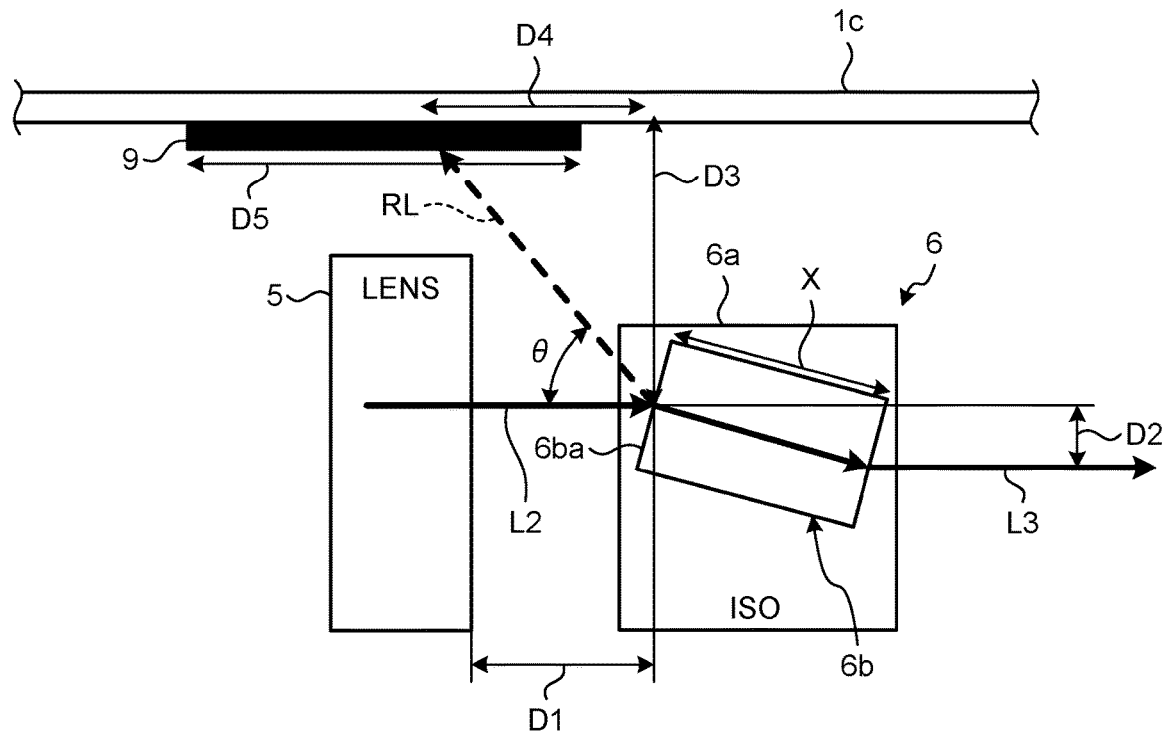
FIG. 2 is a view for explaining the configuration illustrated in FIG. 1.

The following specifically describes the mechanism with reference to FIG. 2. A distance D3 indicates the distance between the position at which the laser light beam L2 is incident on the incident surface 6ba and the surface of the upper lid 1c facing the inside of the housing 1. The distance D3 is preferably 1.0 mm or larger to prevent the magnetism of the magnet 6a of the optical isolator 6 from affecting the system outside the housing 1 or to prevent the optical isolator 6 from being removed due to the attracting force of the magnet 6a of the optical isolator 6 on the upper lid 1c, for example. A distance D4 indicates the distance between the position at which the reflected light beam RL is incident on the surface of the upper lid 1c facing the inside of the housing 1 and the position at which the laser light beam L2 is incident on the incident surface 6ba in a direction parallel to the surface of the upper lid 1c facing the inside of the housing 1. The distance D4 is preferably 2.5 mm or smaller, for example. A length D5 indicates the length in the optical axis direction of the optical attenuator 9 provided on the surface of the upper lid 1c facing the inside of the housing 1. The length D5 is preferably equal to or larger than a length (length in the optical axis direction) LW2 of the beam diameter of the reflected light beam RL when being incident on the surface of the upper lid 1c facing the inside of the housing 1. The optical axis direction is the optical axis direction of the laser light beam L2 serving as a laser light beam to be reflected. The length D5 is preferably LW2/2 or larger in both of the direction toward the semiconductor laser device 4 and the direction toward the optical isolator 6 from the position at which the reflected light beam RL is incident on the surface of the upper lid 1c facing the inside of the housing 1. If the angle θ is 20 degrees, the length D3 is 1.0 mm, and the length D5 is 1.5 mm, the present embodiment suppresses deterioration of the characteristics, unstable operations, and other problems in the semiconductor laser device 4 and reduction in the accuracy of controlling the wavelength of the laser light beam L1 when the beam diameter LW1 of the reflected light beam RL (equal to the beam diameter of the laser light beam L2) is 0.5 mm. The relation between the distance D3, the distance D4, and the angle θ is expressed by Expression (1). The length LW2 is calculated by Expression (2) using the beam diameter LW1 of the reflected light beam RL as the angle θ is given. When X is the length of the optical element part 6b, and n is the refractive index of the optical element part 6b, the relation between the angle θ and the distance D2 is expressed by Expression (3).

$$D4 = \frac{D3}{\tan\theta} \quad (1)$$

$$LW2 = LW1/\sin\theta \quad (2)$$

$$D2 = X\sin\frac{\theta}{2}\left(1 - \frac{\cos\frac{\theta}{2}}{\sqrt{n^2 - \sin^2\frac{\theta}{2}}}\right) \quad (3)$$

When the length X of the optical element part 6b is 1300 μm, and the refractive index n of the optical element part 6b is 2.38, the distance D4 is calculated by Expressions (1) and (2) as follows: when the angle θ is 30 degrees, and the distance D2 is 200 μm, for example, the distance D4 is 1750 μm; when the angle θ is 38 degrees, and the distance D2 is 250 μm, the distance D4 is 1300 μm; and when the angle θ is 45 degrees, and the distance D2 is 300 μm, the distance D4 is 1000 μm. In any of the cases, the optical attenuator 9 can be provided at an effective position in attenuating the reflected light beam RL.

The optical attenuator 9 is provided on the surface of the upper lid 1c. The optical attenuator 9 is made of resin or material including resin and scatters the reflected light beam RL. Examples of the resin include, but are not limited to, epoxy resin, acrylic resin, thermosetting polyimide, etc. The resin includes filler particles having a particle size of 0.1 μm to 500 μm, thereby sufficiently scattering the reflected light beam RL. The filler particles are made of light absorbing material, such as carbon black. The filler particles may be made of light scattering material, such as titanium oxide ($TiO_2$), calcium carbonate ($CaCO_3$), aluminum nitride (AlN), and aluminum oxide ($Al_2O_3$). The optical attenuator 9 may be formed by performing surface treatment on the surface of the upper lid 1c. The optical attenuator 9, for example, may be formed by performing surface roughening of the upper lid 1c so as to scatter the reflected light beam RL. Alternatively, the optical attenuator 9 may be formed by performing surface treatment, such as electroless nickel plating and RAYDENT (registered trademark) treatment, on the surface of the upper lid 1c so as to absorb the reflected light beam RL.

As described above, the optical module 100 according to the first embodiment suppresses deterioration of the characteristics and unstable operations. The optical functional element is not limited to the semiconductor laser device and may be a semiconductor optical amplifier or a light emitting diode, for example. The optical functional element according to the embodiments below may also be a semiconductor optical amplifier or a light emitting diode, for example.

Second Embodiment

Figure 3:
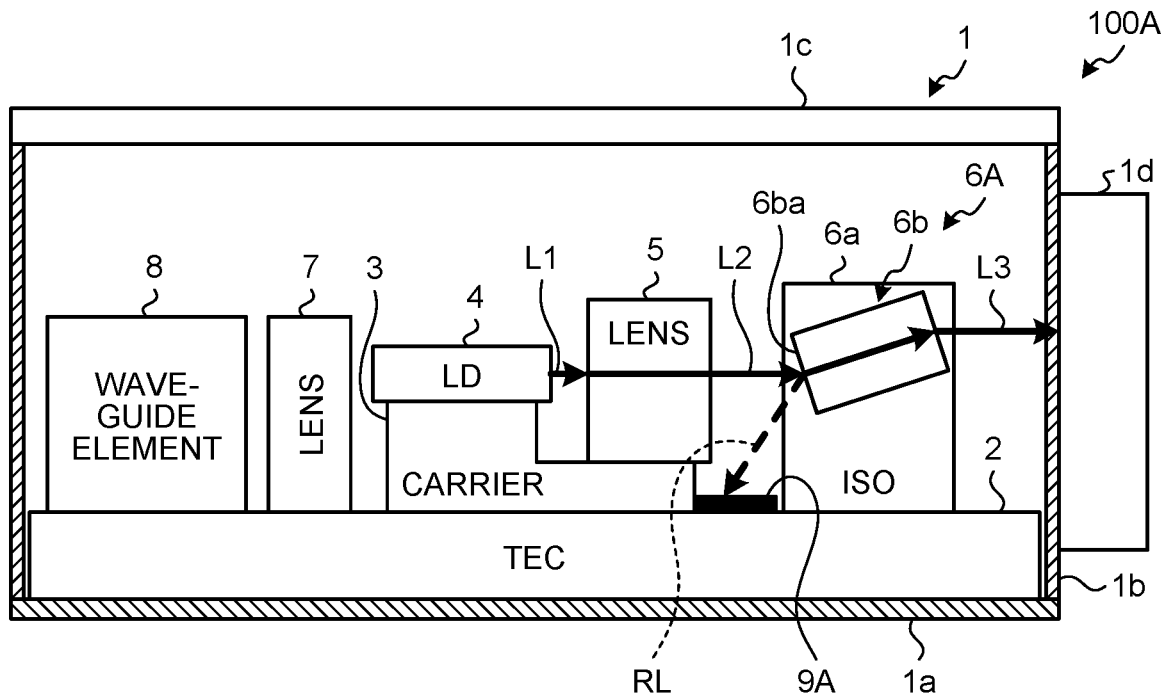
FIG. 3 is a schematic partially cutaway side view of the optical module according to a second embodiment.

FIG. 3 is a schematic partially cutaway side view of the optical module according to a second embodiment. An optical module 100A is obtained by replacing the optical isolator 6 with an optical isolator 6A and replacing the optical attenuator 9 with an optical attenuator 9A in the configuration of the optical module 100 according to the first embodiment. The other components of the optical module 100A are not explained herein because they are the same as the corresponding components of the optical module 100.

The optical isolator 6A is obtained by changing the inclination direction of the optical axis and the incident surface 6ba of the optical element part 6b with respect to the optical axis of the laser light beam L2 in the configuration of the optical isolator 6. As a result, the reflected light beam RL travels toward the thermoelectric cooling element 2 without being coupled to the lens 5.

The optical attenuator 9A is provided on the surface of the thermoelectric cooling element 2 on which the carrier 3 is mounted. The optical attenuator 9A is provided at a position on which the reflected light beam RL is incident to attenuate the power of the reflected light beam RL in the housing 1. Similarly to the optical attenuator 9, the optical attenuator 9A may be made of resin or be formed by performing surface treatment on the surface of the thermoelectric cooling element 2.

The optical module 100A according to the second embodiment suppresses deterioration of the characteristics and unstable operations by the effects similar to those of the optical module 100.

Third Embodiment

Figure 4:
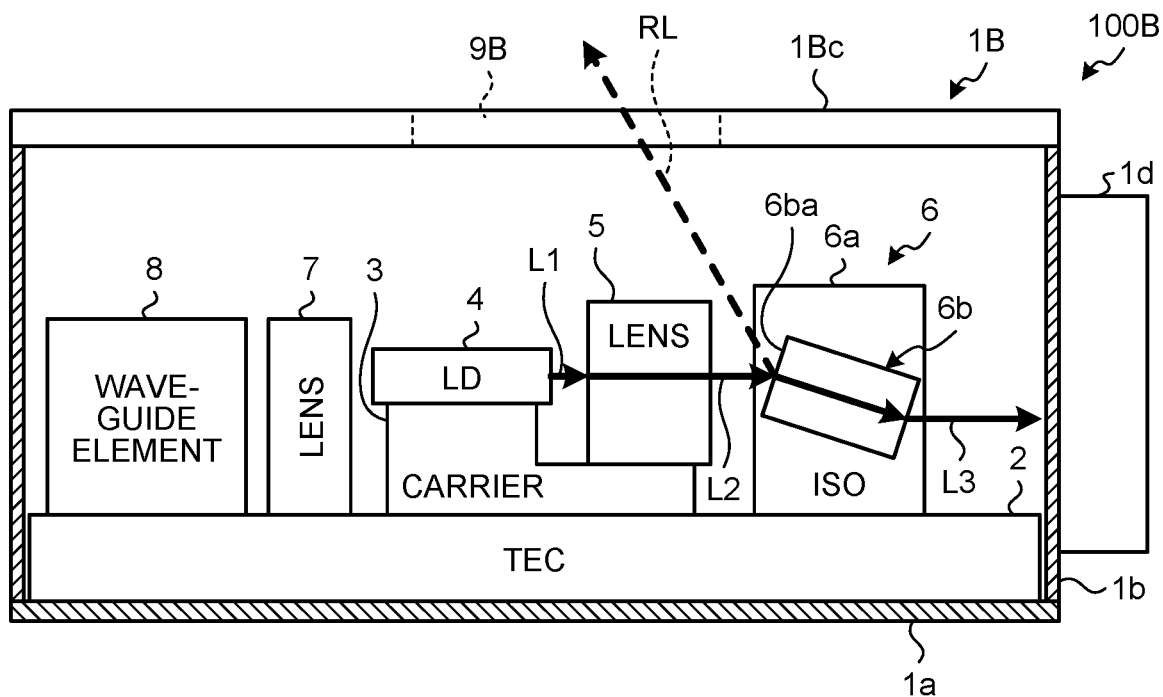
FIG. 4 is a schematic partially cutaway side view of the optical module according to a third embodiment.

FIG. 4 is a schematic partially cutaway side view of the optical module according to a third embodiment. An optical module 100B is obtained by replacing the housing 1 with a housing 1B and replacing the optical attenuator 9 with an optical attenuator 9B in the configuration of the optical module 100 according to the first embodiment. The other components of the optical module 100B are not explained herein because they are the same as the corresponding components of the optical module 100.

The housing 1B is obtained by replacing the upper lid 1c with an upper lid 1Bc in the configuration of the housing 1. The optical attenuator 9B serving as a translucent window is fit into part of the upper lid 1Bc. The optical attenuator 9B is made of material that allows the laser light beam L1 to pass therethrough, such as glass. The optical attenuator 9B preferably has AR coating. The optical attenuator 9B is provided at a position on which the reflected light beam RL is incident to attenuate the power of the reflected light beam RL in the housing 1B by causing the reflected light beam RL to pass therethrough. Consequently, the optical module 100B suppresses deterioration of the characteristics and unstable operations by the effects similar to those of the optical module 100.

Fourth Embodiment

Figure 5:
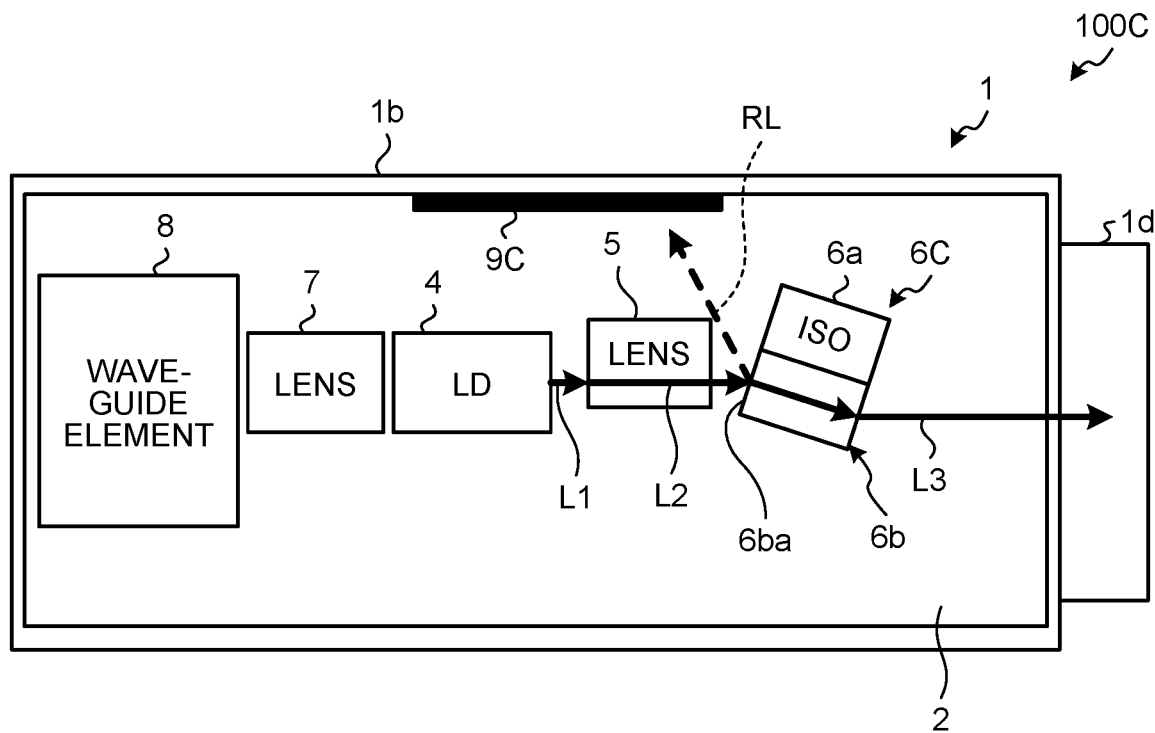
FIG. 5 is a schematic top view of the optical module according to a fourth embodiment.

FIG. 5 is a schematic top view of the optical module according to a fourth embodiment. An optical module 100C is obtained by replacing the optical isolator 6 with an optical isolator 6C and replacing the optical attenuator 9 with an optical attenuator 9C in the configuration of the optical module 100 according to the first embodiment. The other components of the optical module 100C are not explained herein because they are the same as the corresponding components of the optical module 100. The carrier 3 is not illustrated in FIG. 5. FIG. 5 illustrates a state where the upper lid 1c is removed for the sake of explanation. Also in FIGS. 6 to 9, the carrier 3 is not illustrated, and the upper lid 1c is removed.

The optical isolator 6C is obtained by changing the inclination direction of the optical axis and the incident surface 6ba of the optical element part 6b with respect to the optical axis of the laser light beam L2 in the configuration of the optical isolator 6. As a result, the reflected light beam RL travels toward the side wall 1b positioned at the upper part of FIG. 5 without being coupled to the lens 5.

The optical attenuator 9C is provided on the surface of the side wall 1b positioned at the upper part of FIG. 5. The optical attenuator 9C is provided at a position on which the reflected light beam RL is incident to attenuate the power of the reflected light beam RL in the housing 1. Similarly to the optical attenuator 9, the optical attenuator 9C may be made of resin or be formed by performing surface treatment on the surface of the side wall 1b. Consequently, the optical module 100C suppresses deterioration of the characteristics and unstable operations by the effects similar to those of the optical module 100.

Fifth Embodiment

Figure 6:
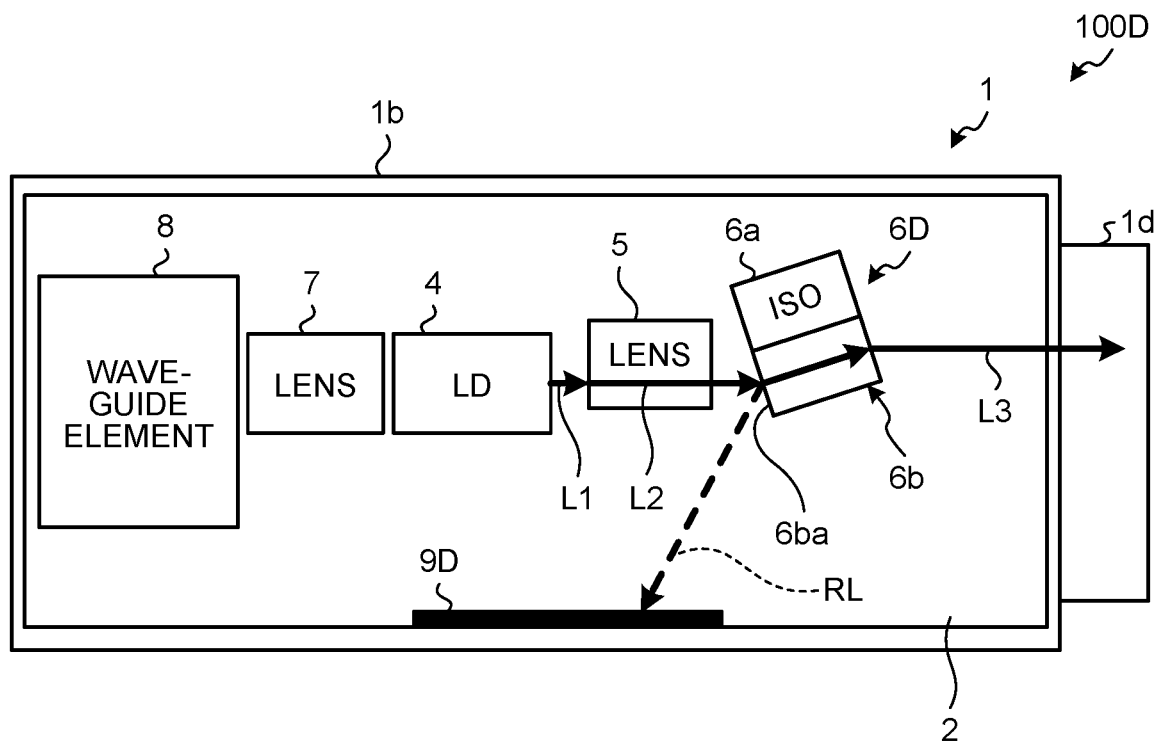
FIG. 6 is a schematic top view of the optical module according to a fifth embodiment.

FIG. 6 is a schematic top view of the optical module according to a fifth embodiment. An optical module 100D is obtained by replacing the optical isolator 6C with an optical isolator 6D and replacing the optical attenuator 9C with an optical attenuator 9D in the configuration of the optical module 100C according to the fourth embodiment. The other components of the optical module 100D are not explained herein because they are the same as the corresponding components of the optical module 100.

The optical isolator 6D is obtained by changing the inclination direction of the optical axis and the incident surface 6ba of the optical element part 6b with respect to the optical axis of the laser light beam L2 in the configuration of the optical isolator 6. As a result, the reflected light beam RL travels toward the side wall 1b positioned at the lower part of FIG. 6 without being coupled to the lens 5.

The optical attenuator 9D is provided on the surface of the side wall 1b positioned at the lower part of FIG. 6. The optical attenuator 9D is provided at a position on which the reflected light beam RL is incident to attenuate the power of the reflected light beam RL in the housing 1. Similarly to the optical attenuator 9, the optical attenuator 9D may be made of resin or be formed by performing surface treatment on the surface of the side wall 1b. Consequently, the optical module 100D suppresses deterioration of the characteristics and unstable operations by the effects similar to those of the optical module 100.

Sixth Embodiment

Figure 7:
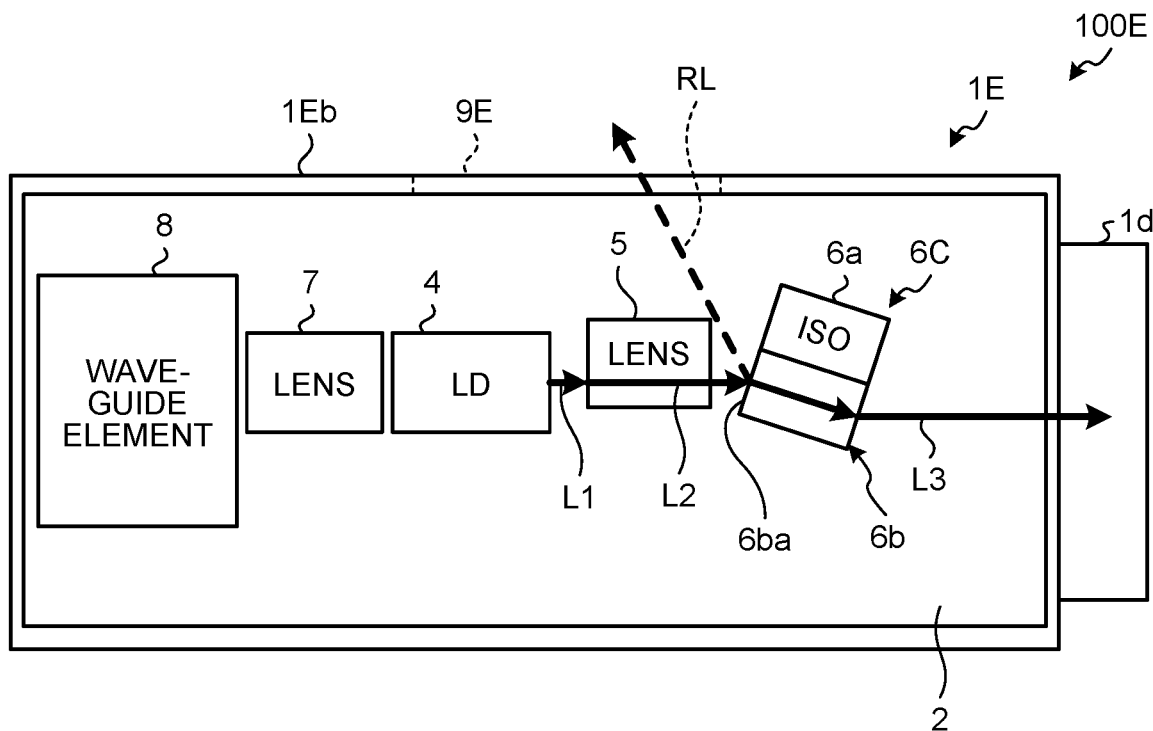
FIG. 7 is a schematic top view of the optical module according to a sixth embodiment.

FIG. 7 is a schematic top view of the optical module according to a sixth embodiment. An optical module 100E is obtained by replacing the housing 1 with a housing 1E and replacing the optical attenuator 9C with an optical attenuator 9E in the configuration of the optical module 100C according to the fourth embodiment. The other components of the optical module 100E are not explained herein because they are the same as the corresponding components of the optical module 100C.

The housing 1E is obtained by replacing the side wall 1b with a side wall 1Eb in a configuration of the housing 1. The optical attenuator 9E serving as a translucent window is fit into part of the side wall 1Eb. The optical attenuator 9E is made of material that allows the laser light beam L1 to pass therethrough, such as glass. The optical attenuator 9E preferably has AR coating. The optical attenuator 9E is provided at a position on which the reflected light beam RL is incident to attenuate the power of the reflected light beam RL in the housing 1E by causing the reflected light beam RL to pass therethrough. Consequently, the optical module 100E suppresses deterioration of the characteristics and unstable operations by the effects similar to those of the optical module 100C.

Seventh Embodiment

Figure 8:
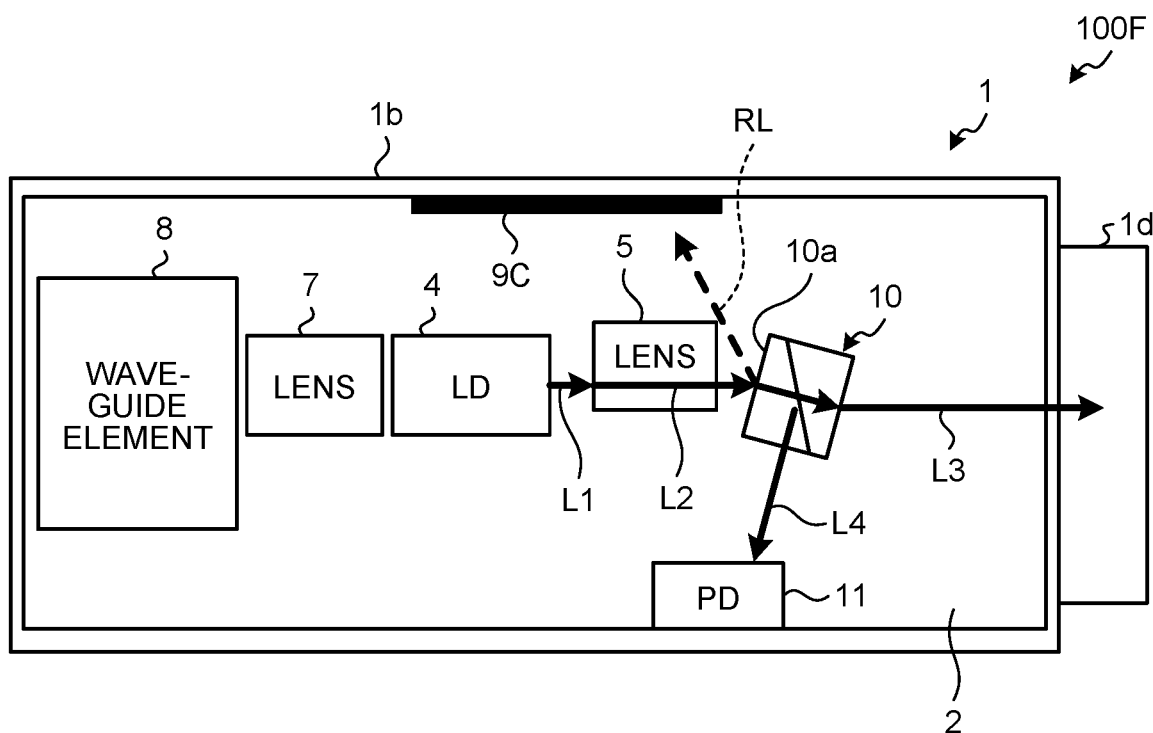
FIG. 8 is a schematic top view of the optical module according to a seventh embodiment.

FIG. 8 is a schematic top view of the optical module according to a seventh embodiment. An optical module 100F is obtained by replacing the optical isolator 6C with a beam splitter 10 and adding a PD 11 in the configuration of the optical module 100C according to the fourth embodiment. The other components of the optical module 100F are not explained herein because they are the same as the corresponding components of the optical module 100.

The beam splitter 10 serving as the second optical part receives the laser light beam L2 on an incident surface 10a. The beam splitter 10 has a partial reflection effect on the laser light beam L2 and divides and outputs the laser light beam L2 as the laser light beam L3 serving as the third light beam and laser light beam L4. The laser light beam L4 is part of the laser light beam L2 and has power corresponding to a few percent of the power of the laser light beam L2, for example. To reduce the reflectivity, the incident surface 10a has AR coating. The reflectivity is 5% or lower and is preferably 2% or lower.

The PD 11 is mounted on the thermoelectric cooling element 2 in the housing 1. The PD 11 receives the laser light beam L4 and outputs current signals. The current signals are output to an external controller and used for a power monitor for the laser light beam L3 similarly to the related-art technology.

The optical axis and the incident surface 10a of the beam splitter 10 incline with respect to the optical axis of the laser light beam L2. With this configuration, the reflected light beam RL generated from the laser light beam L2 on the incident surface 10a travels toward the side wall 1b positioned at the upper part of FIG. 8 without being coupled to the lens 5. The optical attenuator 9C is provided at a position on which the reflected light beam RL is incident to attenuate the power of the reflected light beam RL in the housing 1. Consequently, the optical module 100F suppresses deterioration of the characteristics and unstable operations by the effects similar to those of the optical module 100C.

Eighth Embodiment

Figure 9:
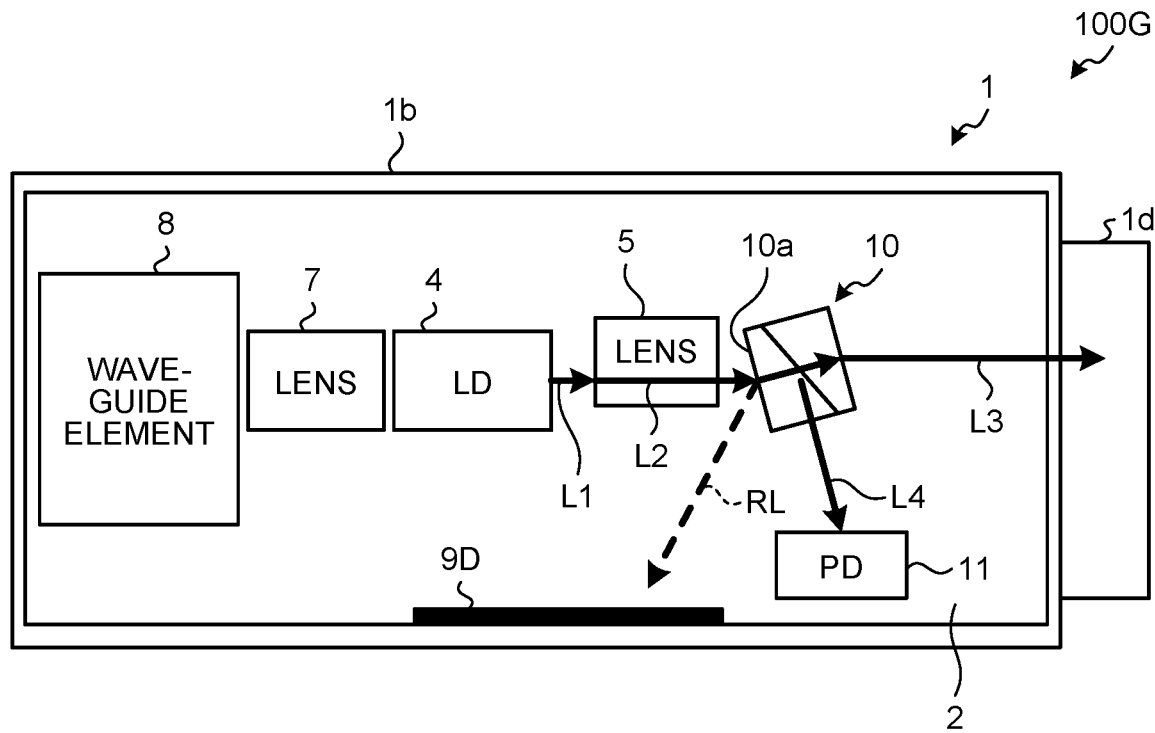
FIG. 9 is a schematic top view of the optical module according to an eighth embodiment.

FIG. 9 is a schematic top view of the optical module according to an eighth embodiment. An optical module 100G is obtained by changing the inclination direction of the optical axis and the incident surface 10a of the beam splitter 10 with respect to the optical axis of the laser light beam L2, and replacing the optical attenuator 9C with the optical attenuator 9D in the configuration of the optical module 100F according to the seventh embodiment. The other components of the optical module 100G are not explained herein because they are the same as the corresponding components of the optical module 100F.

The optical attenuator 9D is provided on the surface of the side wall 1b positioned at the lower part of FIG. 9. The optical attenuator 9D is provided at a position on which the reflected light beam RL is incident to attenuate the power of the reflected light beam RL in the housing 1. Consequently, the optical module 100G suppresses deterioration of the characteristics and unstable operations by the effects similar to those of the optical module 100F.

Ninth Embodiment

Figure 10:
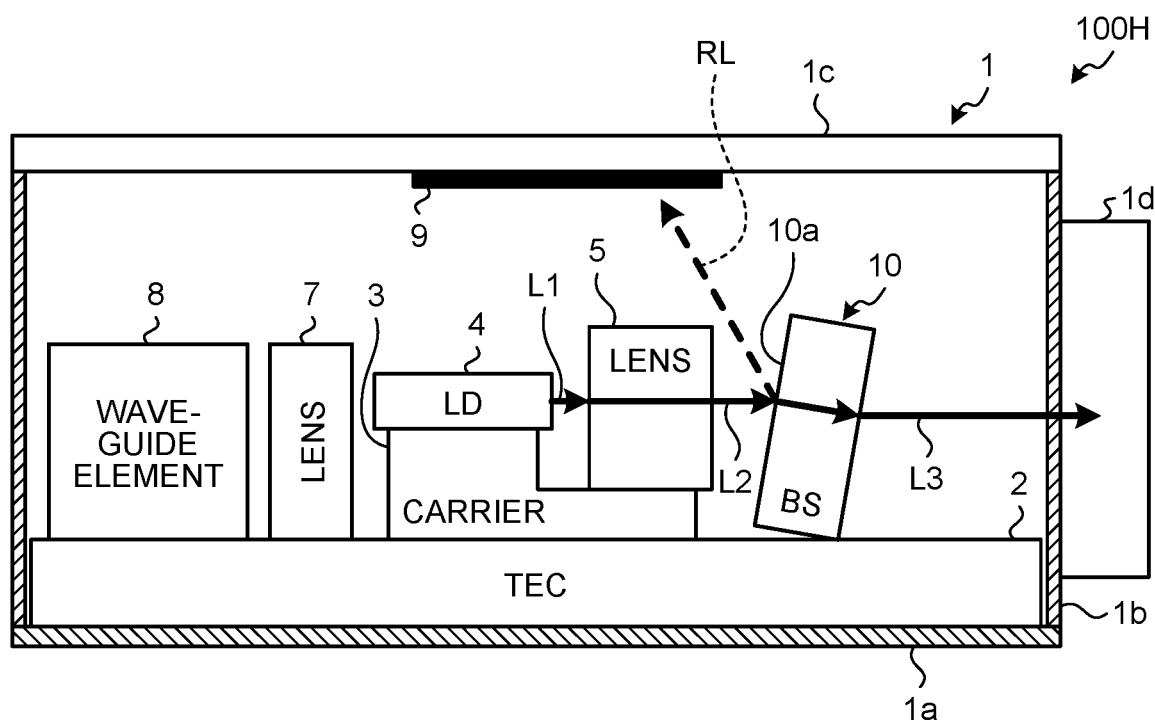
FIG. 10 is a schematic partially cutaway side view of the optical module according to a ninth embodiment.

FIG. 10 is a schematic partially cutaway side view of the optical module according to a ninth embodiment. An optical module 100H is obtained by replacing the optical isolator 6 with the beam splitter 10 and adding a PD, which is not illustrated, in the configuration of the optical module 100 according to the first embodiment. The other components of the optical module 100H are not explained herein because they are the same as the corresponding components of the optical module 100.

The beam splitter 10 outputs part of the laser light beam L2 to the PD, which is not illustrated. The optical axis and the incident surface 10a of the beam splitter 10 incline with respect to the optical axis of the laser light beam L2. With this configuration, the reflected light beam RL generated from the laser light beam L2 on the incident surface 10a travels toward the upper lid 1c without being coupled to the lens 5. The optical attenuator 9 is provided on the surface of the upper lid 1c facing the inside of the housing 1. The optical attenuator 9 is provided at a position on which the reflected light beam RL is incident to attenuate the power of the reflected light beam RL in the housing 1. Consequently, the optical module 100H suppresses deterioration of the characteristics and unstable operations by the effects similar to those of the optical module 100.

Tenth Embodiment

Figure 11:
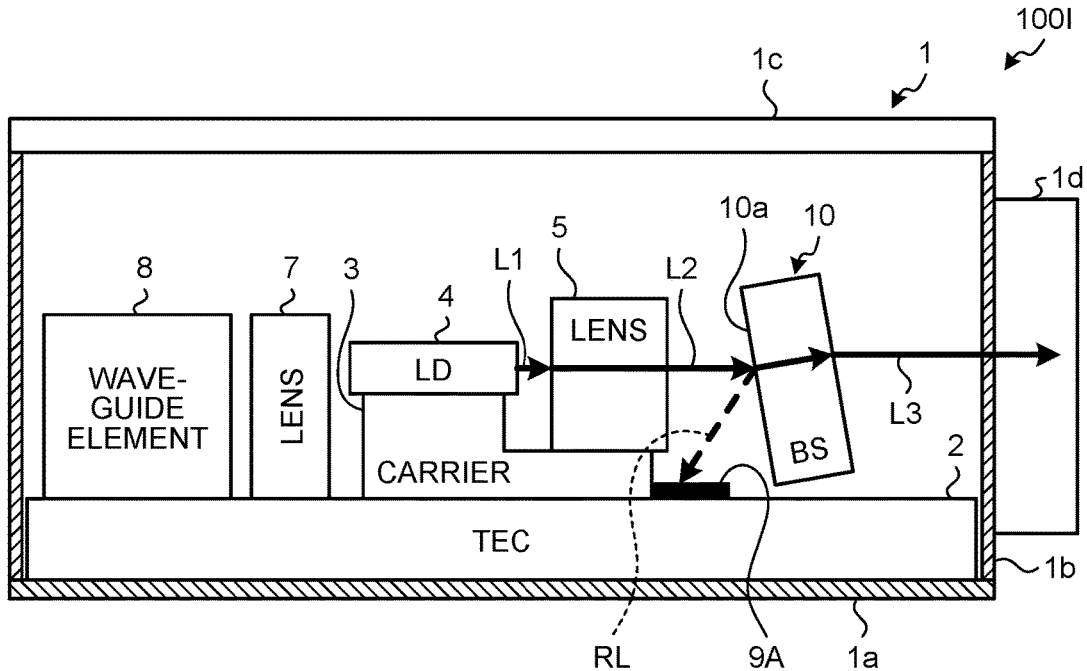
FIG. 11 is a schematic partially cutaway side view of the optical module according to a tenth embodiment.

FIG. 11 is a schematic partially cutaway side view of the optical module according to a tenth embodiment. An optical module 100I is obtained by replacing the optical isolator 6A with the beam splitter 10 and adding a PD, which is not illustrated, in the configuration of the optical module 100A according to the second embodiment. The other components of the optical module 100I are not explained herein because they are the same as the corresponding components of the optical module 100A.

The optical axis and the incident surface 10a of the beam splitter 10 incline opposite to the inclination direction illustrated in FIG. 10 with respect to the optical axis of the laser light beam L2. With this configuration, the reflected light beam RL generated from the laser light beam L2 on the incident surface 10a travels toward the thermoelectric cooling element 2 without being coupled to the lens 5. The optical attenuator 9A is provided on the surface of the thermoelectric cooling element 2 on the side on which the carrier 3 is mounted. The optical attenuator 9A is provided at a position on which the reflected light beam RL is incident to attenuate the power of the reflected light beam RL in the housing 1. Consequently, the optical module 100I suppresses deterioration of the characteristics and unstable operations by the effects similar to those of the optical module 100A.

If the length D5 (corresponding to the length D5 of the optical attenuator 9 in FIG. 2) is equal to or larger than the length LW2, the optical attenuators 9A to 9E can also prevent the reflected light beam RL from causing deterioration of the characteristics, unstable operations, and other problems in the semiconductor laser device 4 and reducing the accuracy of controlling the wavelength of the laser light beam L1. The optical attenuators 9A to 9E are made of resin, are formed by performing surface treatment, such as electroless nickel plating and RAYDENT treatment, so as to absorb the reflected light beam RL, or are made of material that allows the reflected light beam RL to pass therethrough, such as glass. In any of the cases, the length D5 is preferably equal to or larger than the length LW2, and the optical attenuators 9A to 9E are easy to process.

Methods for Assembling

Figure 12:
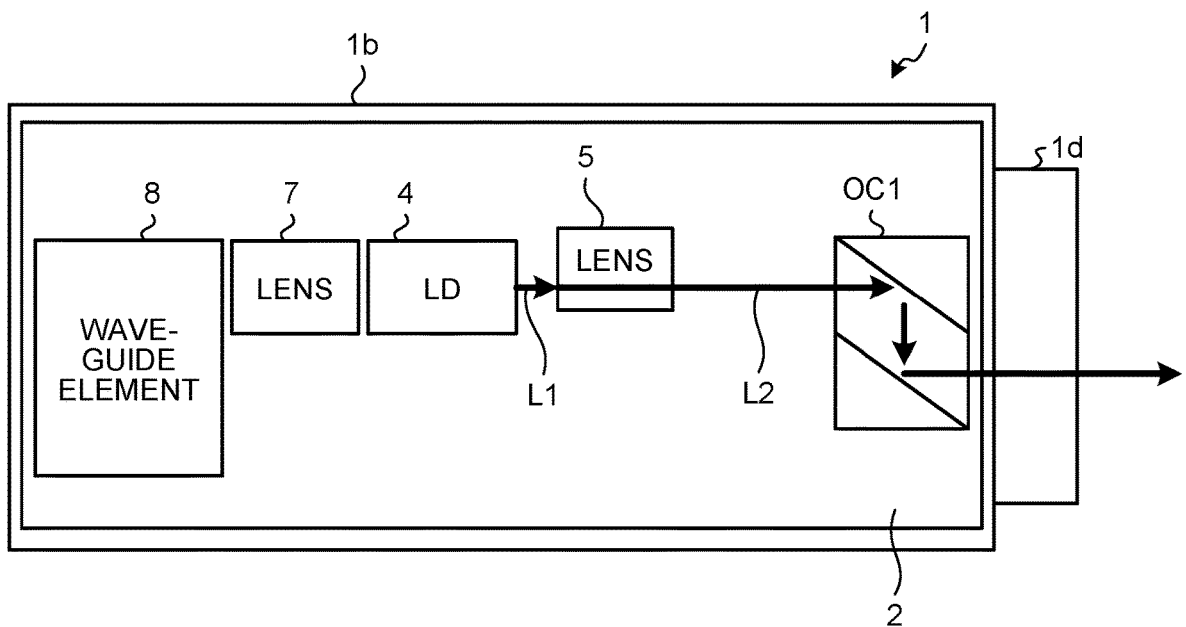
FIG. 12 is a view for explaining an example of a process for manufacturing the optical module.
Figure 13:
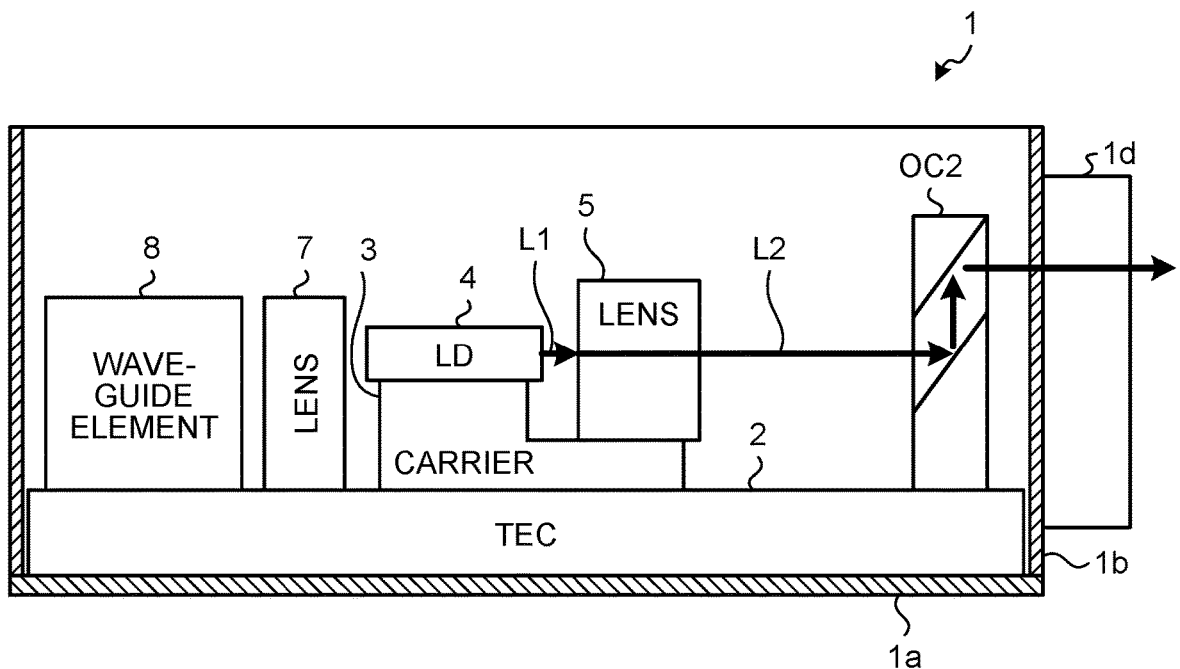
FIG. 13 is a view for explaining another example of the process for manufacturing the optical module.
Figure 14:
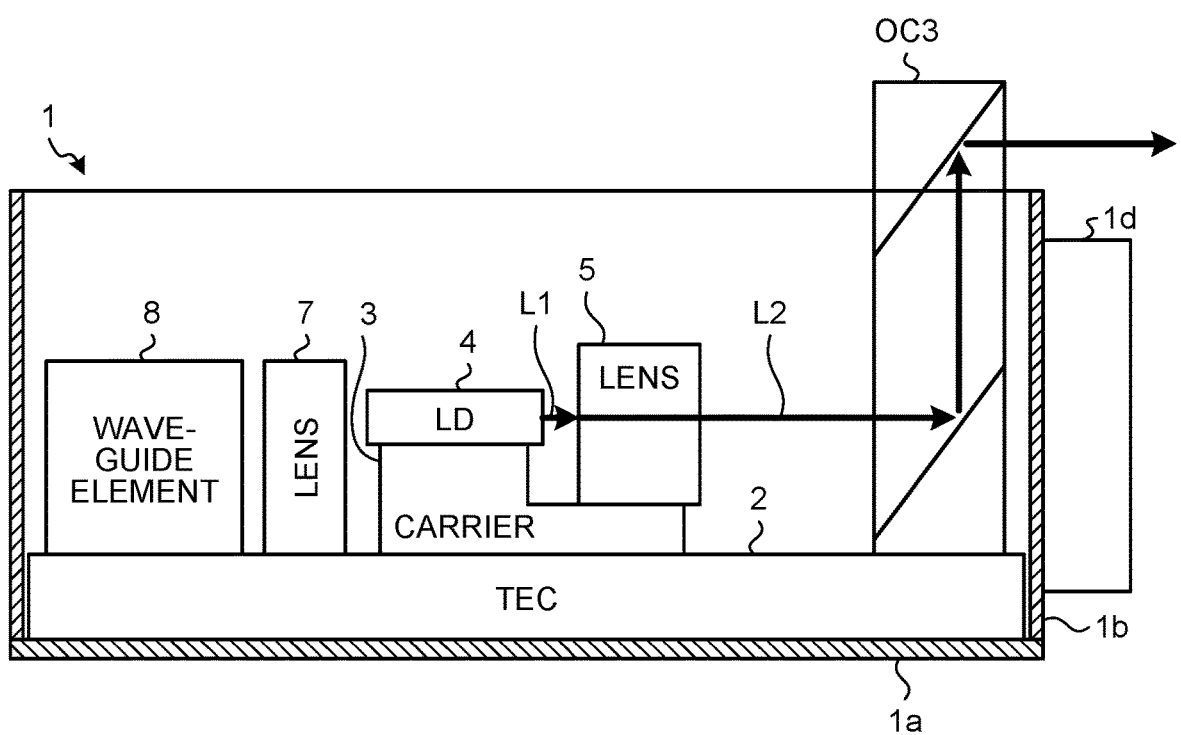
FIG. 14 is a view for explaining still another example of the process for manufacturing the optical module.

FIGS. 12, 13, and 14 are views for explaining an example of a process for manufacturing the optical module according to the embodiments above. All the manufacturing processes illustrated in FIGS. 12 to 14 are processes for aligning the semiconductor laser device 4.

In the example illustrated in FIG. 12, an optical axis conversion element OC1 is used to dispose the semiconductor laser device 4 in the housing 1. The optical axis conversion element OC1 converts the position of the optical axis of the incident laser light beam L2 in the width direction of the housing 1 and outputs the converted laser light beam L2. Providing the element enables verifying the accuracy of the position of the optical axis (in the height and width directions) of the laser light beam L2 and checking the beam quality. Specifically, the accuracy of the position of the optical axis and the beam quality of the laser light beam L2 can be checked by outputting the laser light beam L2 from the light beam output part 1d to the outside of the housing 1 and observing it with a device or the like. Consequently, a small and high-quality optical module can be assembled.

In the example illustrated in FIG. 13, an optical axis conversion element OC2 is used to dispose the semiconductor laser device 4 in the housing 1. The optical axis conversion element OC2 converts the position of the optical axis of the incident laser light beam L2 in the height direction of the housing 1 and outputs the converted laser light beam L2. The accuracy of the position of the optical axis and the beam quality of the laser light beam L2 can be checked by outputting the laser light beam L2 from the light output part 1d to the outside of the housing 1 and observing it with a device or the like. Consequently, a small and high-quality optical module can be assembled.

In the example illustrated in FIG. 14, an optical axis conversion element OC3 is used to dispose the semiconductor laser device 4 in the housing 1. The optical axis conversion element OC3 converts the position of the optical axis of the incident laser light beam L2 in the height direction of the housing 1 and outputs the converted laser light beam L2. The optical axis of the converted laser light beam L2 is positioned above the outside of the housing 1. The accuracy of the position of the optical axis and the beam quality of the laser light beam L2 can be checked by outputting the laser light beam L2 to the outside of the housing 1 and observing it with a device or the like. Consequently, a small and high-quality optical module can be assembled.

Also publicly known are optical axis conversion elements that convert the position of the optical axis of the incident laser light beam and output the converted laser light beam in a direction opposite to the incident direction. The use of such an optical axis conversion element enables outputting the laser light beam L1 from the light output part 1d to the outside of the housing 1 and checking it if the semiconductor laser device 4 is disposed so as to output the laser light beam L1 toward the side wall 1b on the side opposite to the light output part 1d.

The present disclosure can suppress deterioration of the characteristics and unstable operations of the optical module.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical module comprising:
an optical functional element configured to output a first light beam;
a first optical part configured to receive the first light beam, have a predetermined effect on the first light beam, and output the affected first light beam as a second light beam;
a second optical part configured to receive the second light beam, have a predetermined effect on the second light beam, output the affected second light beam as a third light beam, and reflect a reflected light beam in a direction not coupled to the first optical part, the reflected light beam being generated from the second light on an incident surface on which the second light beam is incident;
a housing accommodating the optical functional element, the first optical part, and the second optical part; and
an optical attenuator provided inside the housing and configured to attenuate power of the reflected light beam incident on the optical attenuator in the housing,
wherein the optical attenuator is provided to a part of the housing and is configured to attenuate the reflected light beam by scattering, absorption, or transmission, and
wherein the optical attenuator includes resin that scatters the reflected light beam.

2. The optical module according to claim 1, wherein the first optical part is a lens.

3. The optical module according to claim 1, wherein the second optical part is an optical isolator.

4. The optical module according to claim 1, wherein the housing has a height of 6.5 mm or lower.

5. The optical module according to claim 1, wherein the resin includes filler particles having a particle size of 0.1 μm to 500 μm.

6. The optical module according to claim 1, wherein an angle formed by an optical axis of the first light beam and an optical axis of the reflected light beam is 20 degrees or larger.

7. The optical module according to claim 1, wherein a distance between a position at which the second light beam is output from the first optical part and a position at which the second light beam is incident on the incident surface of the second optical part is 0.3 mm or larger.

8. The optical module according to claim 1, wherein a distance between an optical axis of the second light beam and an optical axis of the third light beam is 300 μm or smaller.

9. The optical module according to claim 1, wherein a wavelength of the first light beam is in a range of 900 nm to 1650 nm.

10. An optical module comprising:
an optical functional element configured to output a first light beam;
a first optical part configured to receive the first light beam, have a predetermined effect on the first light beam, and output the affected first light beam as a second light beam;
a second optical part configured to receive the second light beam, have a predetermined effect on the second light beam, output the affected second light beam as a third light beam, and reflect a reflected light beam in a direction not coupled to the first optical part, the reflected light beam being generated from the second light on an incident surface on which the second light beam is incident;
a housing accommodating the optical functional element, the first optical part, and the second optical part; and
an optical attenuator provided inside the housing and configured to attenuate power of the reflected light beam incident on the optical attenuator in the housing,
wherein the optical attenuator is provided to a part of the housing and is configured to attenuate the reflected light beam by scattering, absorption, or transmission, and
wherein the optical attenuator is formed by performing a surface treatment on the part of the housing.

11. The optical module according to claim 10, wherein the housing has a height of 6.5 mm or lower.

12. The optical module according to claim 10, wherein an angle formed by an optical axis of the first light beam and an optical axis of the reflected light beam is 20 degrees or larger.

13. The optical module according to claim 10, wherein a distance between a position at which the second light beam is output from the first optical part and a position at which the second light beam is incident on the incident surface of the second optical part is 0.3 mm or larger.

14. The optical module according to claim 10, wherein a distance between an optical axis of the second light beam and an optical axis of the third light beam is 300 μm or smaller.

15. The optical module according to claim 10, wherein a wavelength of the first light beam is in a range of 900 nm to 1650 nm.

16. An optical module comprising:
an optical functional element configured to output a first light beam;
a first optical part configured to receive the first light beam, have a predetermined effect on the first light beam, and output the affected first light beam as a second light beam;
a second optical part configured to receive the second light beam, have a predetermined effect on the second light beam, output the affected second light beam as a third light beam, and reflect a reflected light beam in a direction not coupled to the first optical part, the reflected light beam being generated from the second light on an incident surface on which the second light beam is incident;

a housing accommodating the optical functional element, the first optical part, and the second optical part; and an optical attenuator provided inside the housing and configured to attenuate power of the reflected light beam incident on the optical attenuator in the housing, wherein the optical attenuator is provided to a part of the housing and is configured to attenuate the reflected light beam by scattering, absorption, or transmission, and wherein the optical attenuator is a translucent window provided to the part of the housing.

17. The optical module according to claim 16, wherein the housing has a height of 6.5 mm or lower.

18. The optical module according to claim 16, wherein an angle formed by an optical axis of the first light beam and an optical axis of the reflected light beam is 20 degrees or larger.

19. The optical module according to claim 16, wherein a distance between a position at which the second light beam is output from the first optical part and a position at which the second light beam is incident on the incident surface of the second optical part is 0.3 mm or larger.

20. The optical module according to claim 16, wherein a distance between an optical axis of the second light beam and an optical axis of the third light beam is 300 µm or smaller.

* * * * *